(12) United States Patent
Liu et al.

(10) Patent No.: US 9,921,620 B2
(45) Date of Patent: Mar. 20, 2018

(54) METHOD FOR MANUFACTURING HOUSING

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Shyan-Juh Liu, New Taipei (TW); Kar-Wai Hon, New Taipei (TW); Sha-Sha Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/348,946

(22) Filed: Nov. 10, 2016

(65) Prior Publication Data
US 2017/0060200 A1    Mar. 2, 2017

Related U.S. Application Data

(62) Division of application No. 14/446,503, filed on Jul. 30, 2014, now Pat. No. 9,538,673.

(30) Foreign Application Priority Data

Jul. 30, 2013    (CN) .......................... 2013 1 0324648

(51) Int. Cl.
| | |
|---|---|
| *G06F 1/20* | (2006.01) |
| *H05K 5/02* | (2006.01) |
| *H05K 7/20* | (2006.01) |
| *G03F 7/20* | (2006.01) |
| *G03F 7/42* | (2006.01) |

(52) U.S. Cl.
CPC ............... *G06F 1/20* (2013.01); *G03F 7/20* (2013.01); *G03F 7/42* (2013.01); *H05K 5/0213* (2013.01); *H05K 7/20409* (2013.01)

(58) Field of Classification Search
CPC .... G06F 1/20; G03F 7/20; G03F 7/42; H05K 7/20409; H05K 5/0213
See application file for complete search history.

(56) References Cited

U.S. PATENT DOCUMENTS

2007/0207619 A1    9/2007    Yoo et al.

FOREIGN PATENT DOCUMENTS

| CN | 1540714 A | 10/2004 | |
|---|---|---|---|
| CN | 101654221 A | 2/2010 | |
| CN | 101423188 B | * 6/2011 | ............... B82B 3/00 |
| JP | 2012059795 A | * 3/2012 | ........... H01L 23/373 |
| TW | M375238 | 3/2010 | |
| TW | I384932 | 2/2013 | |

OTHER PUBLICATIONS

Xiaoguang Tu CN 101423188 B Machine Translation.*
Koizumi, Tomoaki JP 2012059795 A Machine Translation.*

* cited by examiner

*Primary Examiner* — Nadine Norton
*Assistant Examiner* — Mahmoud Dahimene
(74) *Attorney, Agent, or Firm* — ScienBiziP, P.C.

(57) ABSTRACT

A method for manufacturing a housing of an electronic device includes the following steps. An area not to be etched is shielded and an etching area is exposed. The etching area is etched by photolithography and forming a plurality of heat dissipation holes of nanometer scale in the etching area. The area not to be etched is cleaned for removing the shielding.

11 Claims, 5 Drawing Sheets

METHOD FOR MANUFACTURING HOUSING

CROSS-REFERENCE TO RELATED APPLICATION

The present application is a divisional application of U.S. patent application Ser. No. 14/446,503, filed on Jul. 30, 2014, which claims priority to Chinese Application No. 201310324648.X filed on Jul. 30, 2013, the contents of which are entirely incorporated by reference herein.

FIELD

The subject matter herein generally relates to a method for manufacturing a housing of an electronic device.

BACKGROUND

Electronic devices generate heat in use. This heat can be detrimental to device operation. Therefore, ways of reducing or dispersing the heat can be helpful.

BRIEF DESCRIPTION OF THE DRAWINGS

Implementations of the present technology will now be described, by way of example only, with reference to the attached figures.

DETAILED DESCRIPTION

Figure 1:
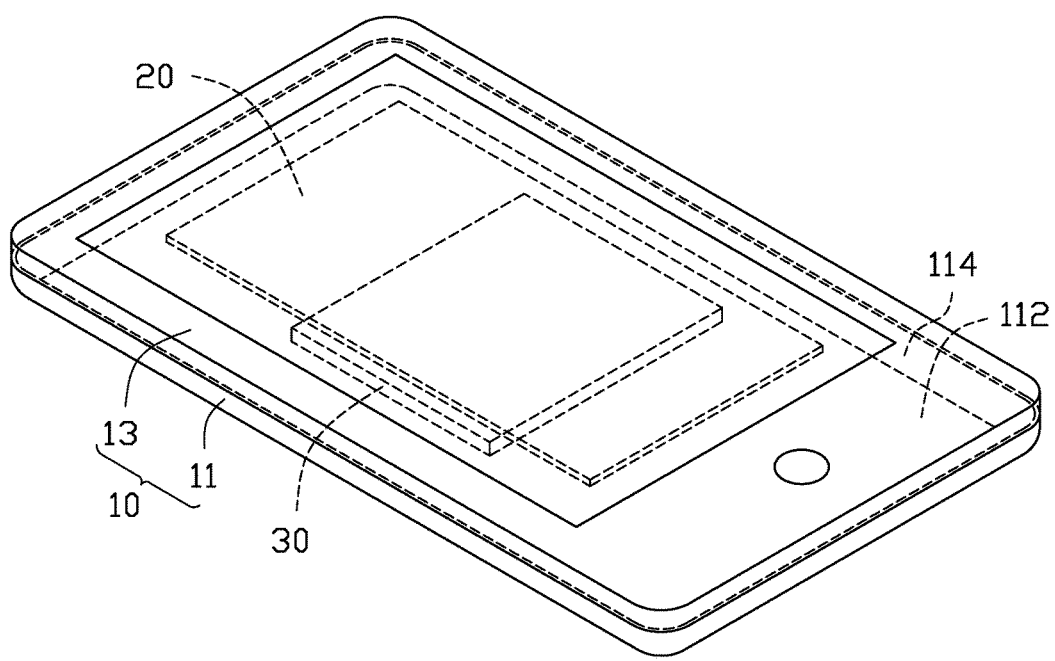
FIG. 1 is an assembled, isometric view of a first exemplary embodiment of an electronic device including a housing.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates an electronic device 100 of a first exemplary embodiment. The electronic device 100 can be a mobile phone, or a pad, or others. The electronic device 100 can include a housing 10, a mother board 20, and a battery 30. The mother board 20 and a battery 30 generates heat when the electronic device 100 in use. The electronic device 100 can include other functional modules, such as a display module, not described here for simplicity.

Figure 2:
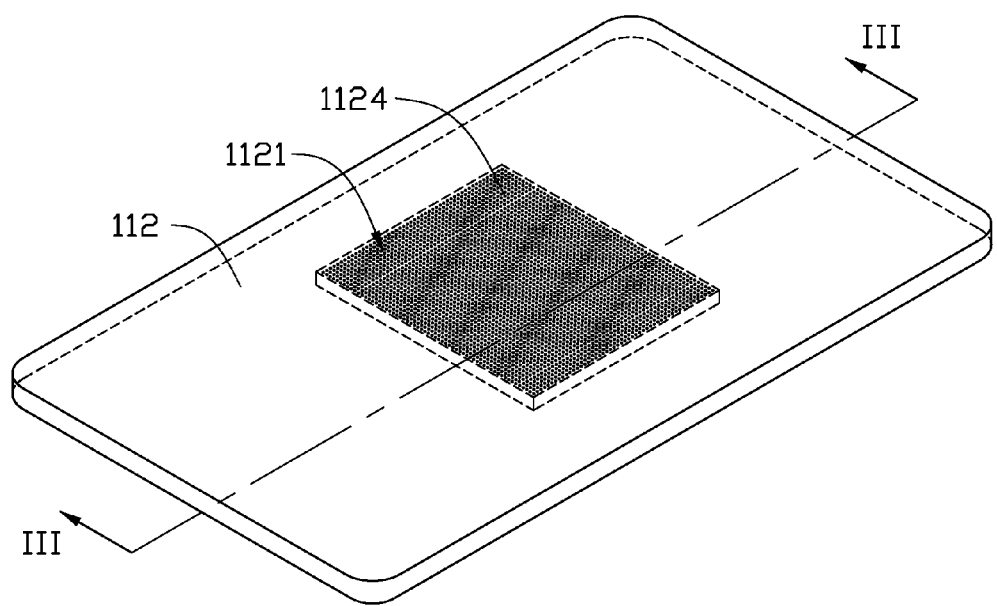
FIG. 2 is similar to FIG. 1, but viewed from another angle.
Figure 3:
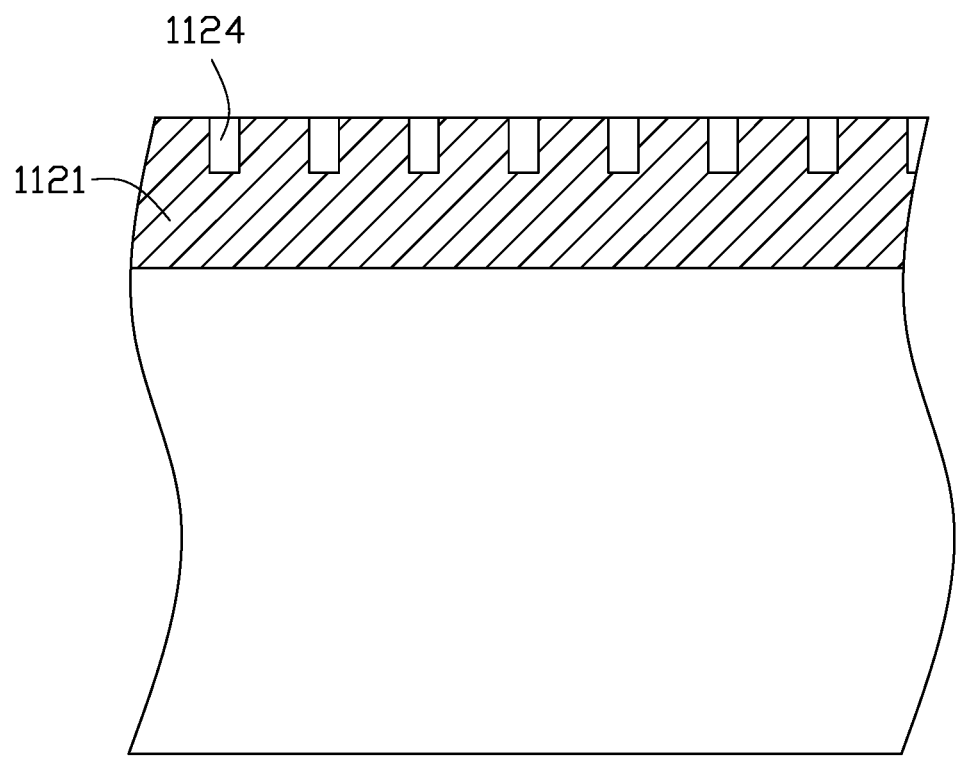
FIG. 3 is a partial cross-sectional view of the housing defining a plurality of heat dissipation holes of FIG. 2 taken along line III-III.

The housing 10 can include a bottom case 11 and a top cover 13, though these orientations are a function of how the device is held and the bottom case 11 and top cover 13 may be inverted if the user holds the device up-side down. The bottom case 11 can be substantially rectangular and made of aluminum alloy. The bottom case 11 can include a bottom wall 112 and a peripheral wall 114 integrated with the bottom wall 112. The peripheral wall 114 can extend from edges of the bottom wall 112 toward an upside of the bottom wall 112. The top cover 13 can be positioned over the peripheral wall 114. The top cover 13 and the bottom case 11 form a receiving space (not numbered) for receiving the functional modules. The bottom wall 112 can include a heat dissipation area 1121. FIGS. 2 and 3 illustrate a plurality of heat dissipation holes 1124 can be defined in an outer surface of the heat dissipation area 1121. The heat dissipation holes 1124 can be arranged in a matrix and distributed evenly in the heat dissipation area 1121. The heat dissipation holes 1124 can be blind holes, which extend up along a direction substantially perpendicular to the bottom wall 112. A diameter of each heat dissipation hole 1124 can be in a nanometer scale range from about 10 to 100 nanometers. A ration of diameter of each heat dissipation hole 1124 to a depth of each heat dissipation hole 1124 can be in a range from about 1:2 to about 1:10000. The cross-sectional shape of the heat dissipation hole 1124 along a direction substantially perpendicular to an axis of the heat dissipation hole can be circular.

The battery 20 and the mother board 30 can be fixed in the receiving space with fixing structures (not shown), and can be electrically coupled each other. The battery 30 can be positioned adjacent to the bottom wall 112 and corresponding to the heat dissipation area 1121 in position.

The heat dissipation holes 1124 can act as heat sinks when the electronic device 100 is in use, because a specific surface of each heat dissipation hole 1124 is relatively large.

Figure 4:
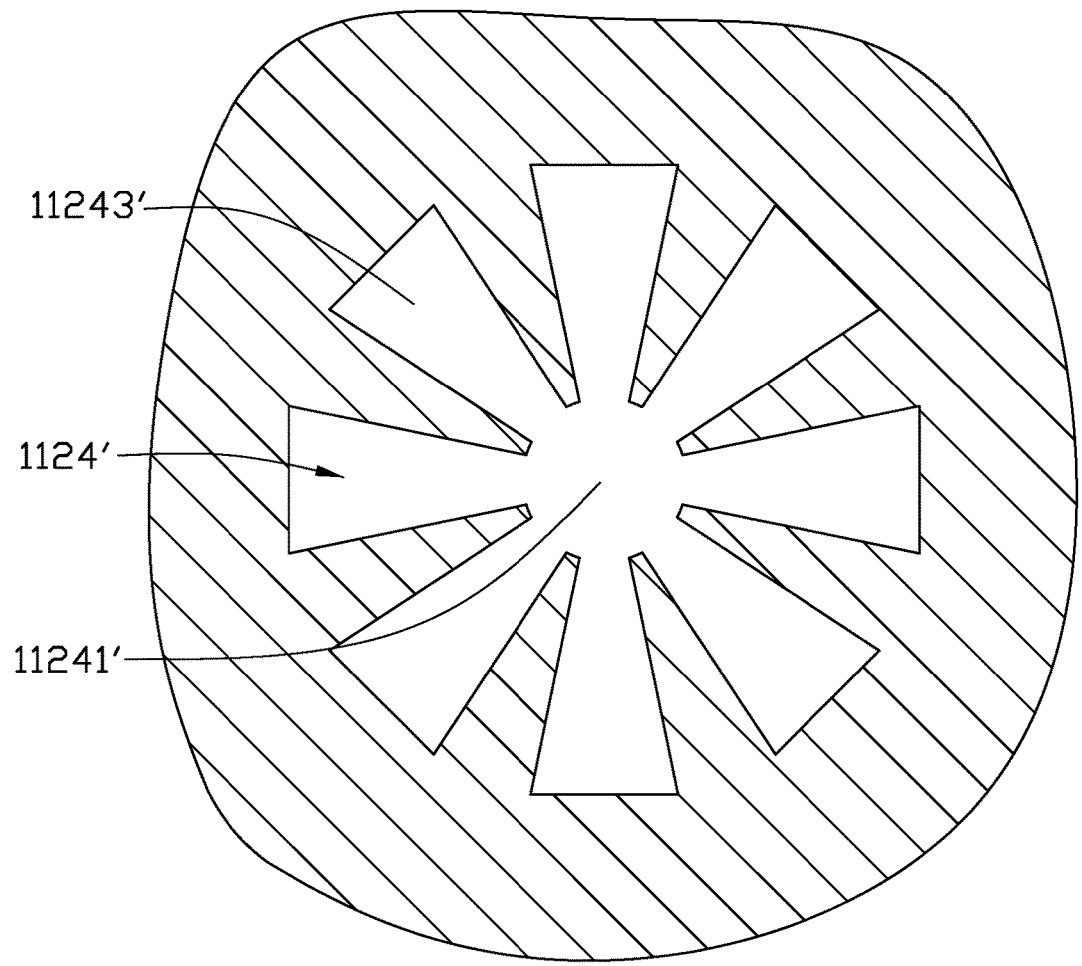
FIG. 4 is a cross-sectional view of a heat dissipation hole of an electronic device of a second exemplary embodiment.

In other exemplary embodiments, the heat dissipation area 1121 can be positioned with other heat generating members, such as a central processing unit. Positions of the heating generating members can deviate from the heat dissipation area 1121, when the heating generating members would interfere with other structures of the electronic device 100. The heat dissipation area 1121 can be also formed in the top cover 13 corresponding to the heat-generating members in position. The number of the heat dissipation areas 1121 is not limited to one, it can be two, or more. The cross-sectional shape of each heat dissipation hole 1124 along a direction substantially perpendicular to an axis of the heat dissipation hole 1124 can also be in other shapes, such as polygon. FIG. 4 illustrates a cross-sectional shape of each heat dissipation hole 1124' along a direction substantially perpendicular to a longitudinal axis of the heat dissipation hole. The cross-sectional shape can include a plurality of echelons 11243' protruding from an edge of a circular main body 11241'.

Figure 5:
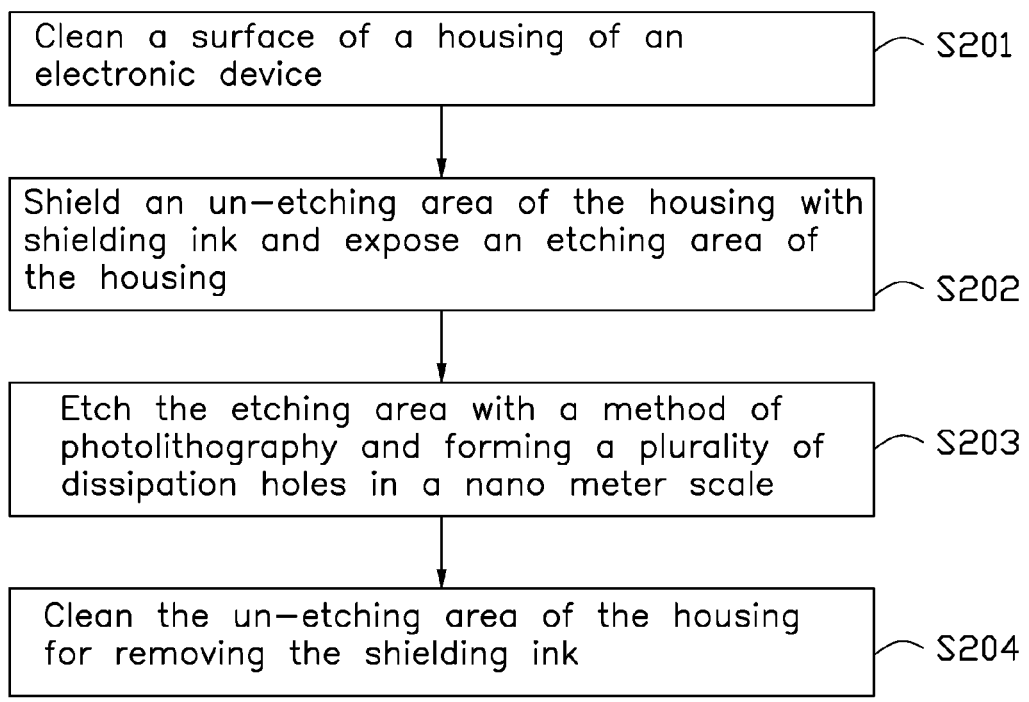
FIG. 5 is a flowchart of a method for manufacturing the housing of electronic device of FIG. 1.

FIG. 5 illustrates an exemplary process and method for manufacturing a housing of an electronic device.

In block 201, a housing of an electronic device can be cleaned by washing, oil removing, polishing of the housing, so that bolts and impurities can be removed. In other exemplary embodiments, the block 201 can be omitted, when the housing is already clean.

In block 202, an area of the housing to not be etched can be shielded using a coating shielding ink and an area of the housing to be etched is left exposed. The etching area can be towards the battery. In the illustrated exemplary embodiment, the shielding ink can be ultra violet curing ink or thermoset ink.

In block 203, the etching area can be etched by using photolithography and a plurality of heat dissipation holes of nanometer scale can be formed. In the illustrated exemplary embodiment, preset nano patterns can be formed in the housing by nano imprint or nanosphere lithography, and the plurality of heat dissipation holes then can be formed by chemical etching, or plasma etching, or reactive ion etchings, then a plurality of heat dissipation holes with perdetermined shapes are formed. A diameter of each heat dissipation hole can between about 10 and 100 nanometers in size. The ratio of a diameter of each heat dissipation hole to a depth of each heat dissipation hole can be in a range from about 1:2 to about 1:10000. The cross-sectional shape of the heat dissipation hole along a direction substantially perpendicular to an axis of the heat dissipation hole can be circular.

In block 204, the non-etched area of the housing can be cleaned to remove the shielding ink.

The exemplary embodiments shown and described above are only examples. Many details are often found in the art such as the other features of a vacuum generator. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A method for manufacturing a housing of an electronic device containing at least one heat generating member, the housing comprising an etching area and an area not to be etched, comprising:
    shielding the area not to be etched by shielding ink;
    leaving the etching area exposed;
    forming a plurality of preset nano patterns in the etching area by nano-imprint or nanosphere lithography;
    etching the etching area and forming a plurality of heat dissipation holes of nanometer scale in the etching area; and
    cleaning the area not to be etched to remove the shielding ink;
    wherein the plurality of dissipation holes extends from an outer surface of the etching area toward the at least one heat-generating member, a cross-sectional shape of each dissipation hole is substantially perpendicular to an axis of the dissipation hole, and a plurality of echelons protrudes from an edge of a substantially circular dissipation area.

2. The manufacturing method of claim 1, wherein the heat dissipation holes are blind holes.

3. The manufacturing method of claim 1, wherein a hole diameter of each heat dissipation hole is from about 10 to 100 nanometers, the ratio of a diameter of each heat dissipation hole to a depth of each heat dissipation hole is in a range from about 1:2 to about 1:10.

4. The manufacturing method of claim 1, wherein the heat dissipation holes are formed by chemical etching, or plasma etching, or reactive ion etching.

5. The manufacturing method of claim 1, wherein the method further comprising cleaning the housing before shielding the area not to be etched and exposing the etching area.

6. The manufacturing method of claim 1, wherein the shielding ink is selected from ultra violet curing ink and thermoset ink.

7. A method for manufacturing a housing of an electronic device containing at least one heat generating member, the housing comprising an etching area and an area not to be etched, comprising:
    shielding the area not to be etched by shielding ink and exposing the etching area;
    forming a plurality of preset nano patterns in the etching area by nano-imprint or nanosphere lithography;
    etching the etching area and forming a plurality of heat dissipation holes of nanometer scale in the etching area; and
    cleaning the area not to be etched to remove the shielding ink,
    wherein the plurality of heat dissipation holes is defined in an outer surface of a dissipation area, and each heat dissipation hole is in a nanometer scale, the plurality of heat dissipation holes is blind holes, a ratio of a diameter of each heat dissipation hole to a depth of each heat dissipation hole is in a range from about 1:2 to about 1:10, the plurality of heat dissipation holes extends from the outer surface toward the plurality of heat-generating members, a cross-sectional shape of each heat dissipation hole is substantially perpendicular to an axis of the dissipation hole, and a plurality of echelons protrudes from an edge of a substantially circular dissipation area.

8. The manufacturing method of claim 7, wherein a hole diameter of each heat dissipation hole is from about 10 to 100 nanometers.

9. The manufacturing method of claim 7, wherein the plurality of heat dissipation holes is formed by chemical etching, or plasma etching, or reactive ion etching.

10. The manufacturing method of claim 7, wherein the method further comprising cleaning the housing before shielding the area not to be etched and exposing the etching area.

11. The manufacturing method of claim 7, wherein the shielding ink is selected from ultra violet curing ink and thermoset ink.

* * * * *